United States Patent
Koshii

(10) Patent No.: US 11,469,679 B2
(45) Date of Patent: Oct. 11, 2022

(54) POWER CONVERTER DEVICE WITH NON-OVERLAPPING BUS BARS

(71) Applicant: FUJI ELECTRIC CO., LTD., Kawasaki (JP)

(72) Inventor: Keita Koshii, Kobe (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 126 days.

(21) Appl. No.: 16/662,805

(22) Filed: Oct. 24, 2019

(65) Prior Publication Data
US 2020/0059163 A1 Feb. 20, 2020

Related U.S. Application Data

(63) Continuation of application No. PCT/JP2018/033753, filed on Sep. 12, 2018.

(30) Foreign Application Priority Data

Nov. 14, 2017 (JP) .............................. JP2017-219430

(51) Int. Cl.
*H02M 7/00* (2006.01)
*H02G 5/02* (2006.01)
*H05K 7/02* (2006.01)

(52) U.S. Cl.
CPC .............. *H02M 7/003* (2013.01); *H02G 5/02* (2013.01); *H05K 7/02* (2013.01)

(58) Field of Classification Search
CPC ...... H02M 7/003; H02M 1/44; H05K 7/1485; H05K 7/02; H05K 7/1432; H02B 1/32; H02B 1/308; H02B 1/20; H02G 5/02
See application file for complete search history.

(56) References Cited

U.S. PATENT DOCUMENTS

2011/0280056 A1  11/2011  Noda

FOREIGN PATENT DOCUMENTS

| CN | 107395027 A | * | 11/2017 |
|---|---|---|---|
| JP | 2004-120898 A | | 4/2004 |
| JP | 2011-167056 A | | 8/2011 |
| JP | 2013-106473 A | | 5/2013 |
| JP | 2014-073811 A | | 4/2014 |
| JP | 2015-077035 A | | 4/2015 |
| JP | 2016208601 | † | 12/2016 |
| JP | 2016208601 A | * | 12/2016 |

OTHER PUBLICATIONS

PCT/ISA/210, "International Search Report for International Application No. PCT/JP2018/033753," dated Dec. 4, 2018.
PCT/ISA/237, "Written Opinion by the International Search Authority for International Application No. PCT/JP2018/033753," dated Dec. 4, 2018.

* cited by examiner
† cited by third party

*Primary Examiner* — Kyle J Moody
*Assistant Examiner* — Jye-June Lee
(74) *Attorney, Agent, or Firm* — Manabu Kanesaka

(57) ABSTRACT

In a power conversion device, cable connection positions of connections in which a plurality of bus bars is respectively connected to external line cables are non-overlapping with each other as viewed from a side on which the external line cables are pulled out.

14 Claims, 6 Drawing Sheets

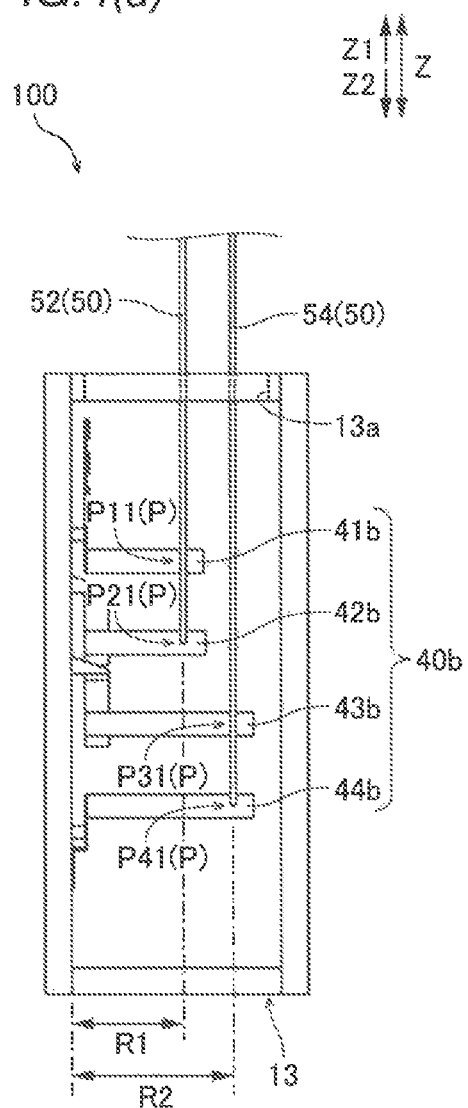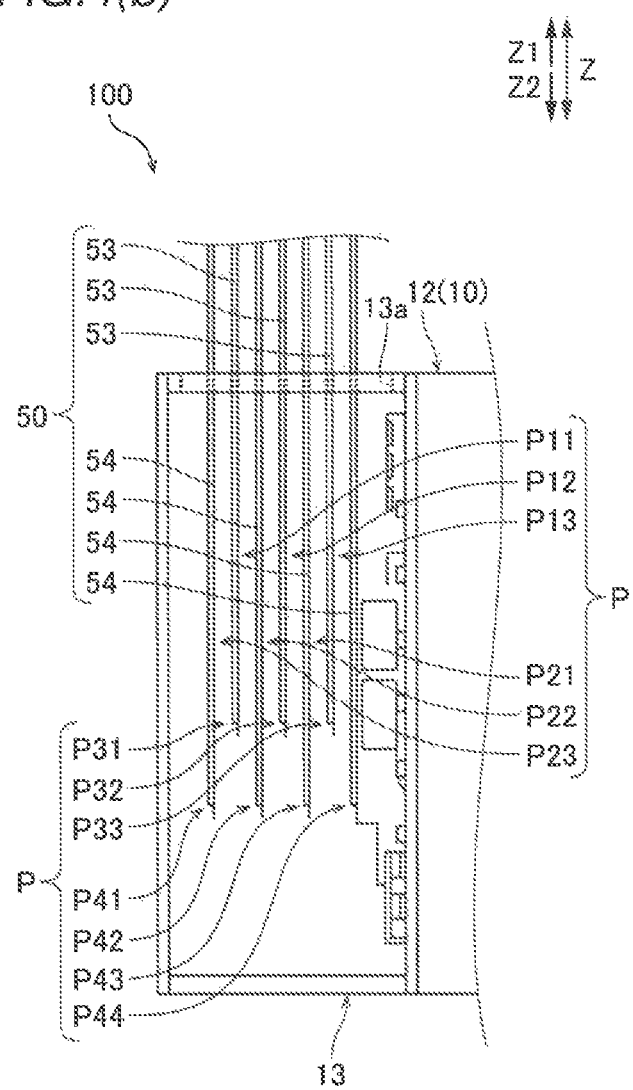

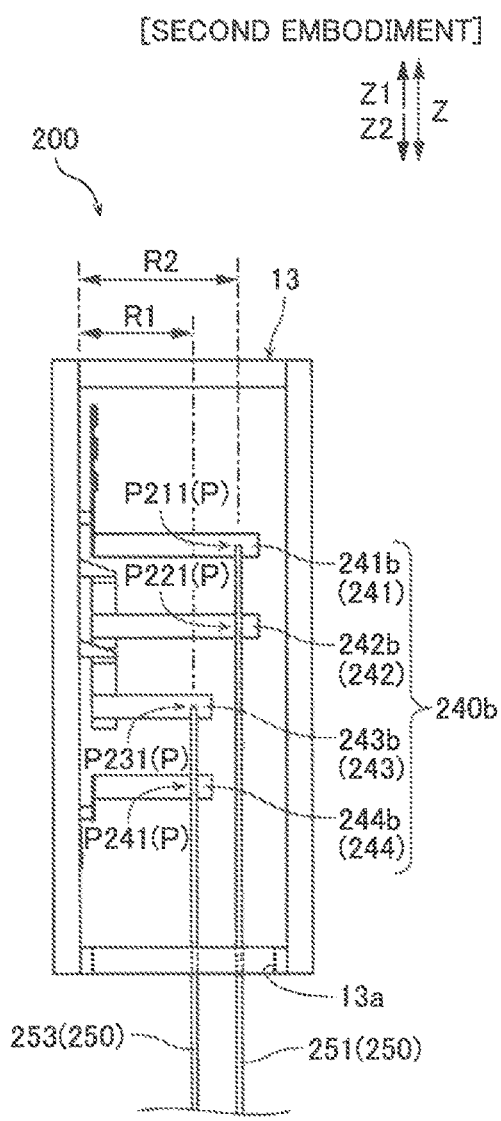
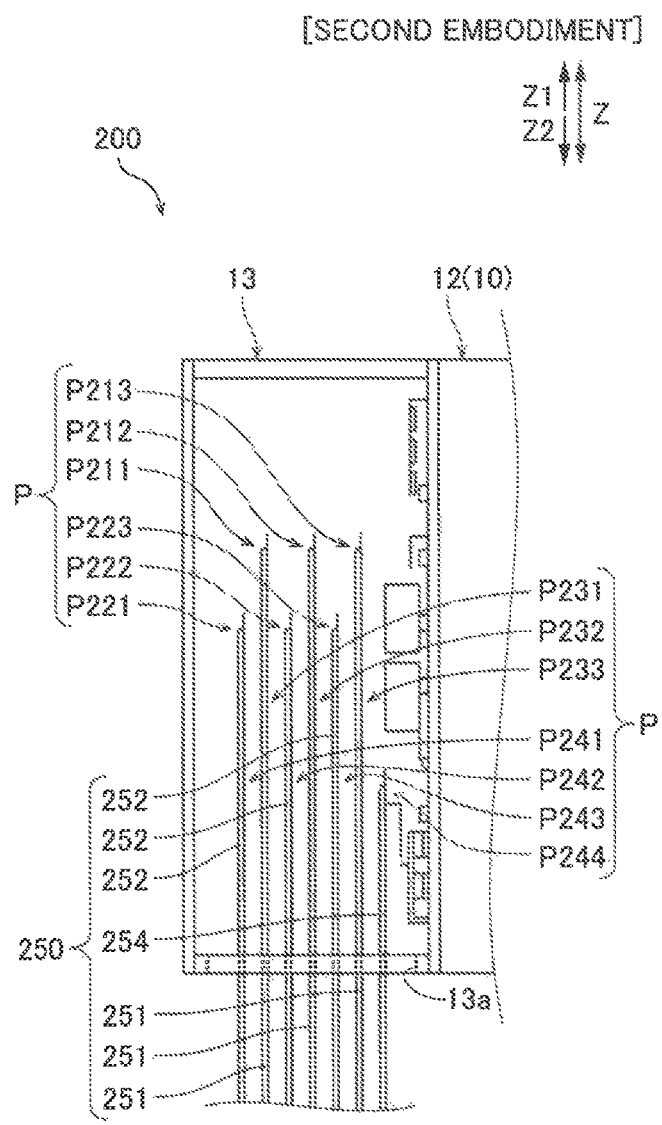

FIG.6 [THIRD EMBODIMENT]
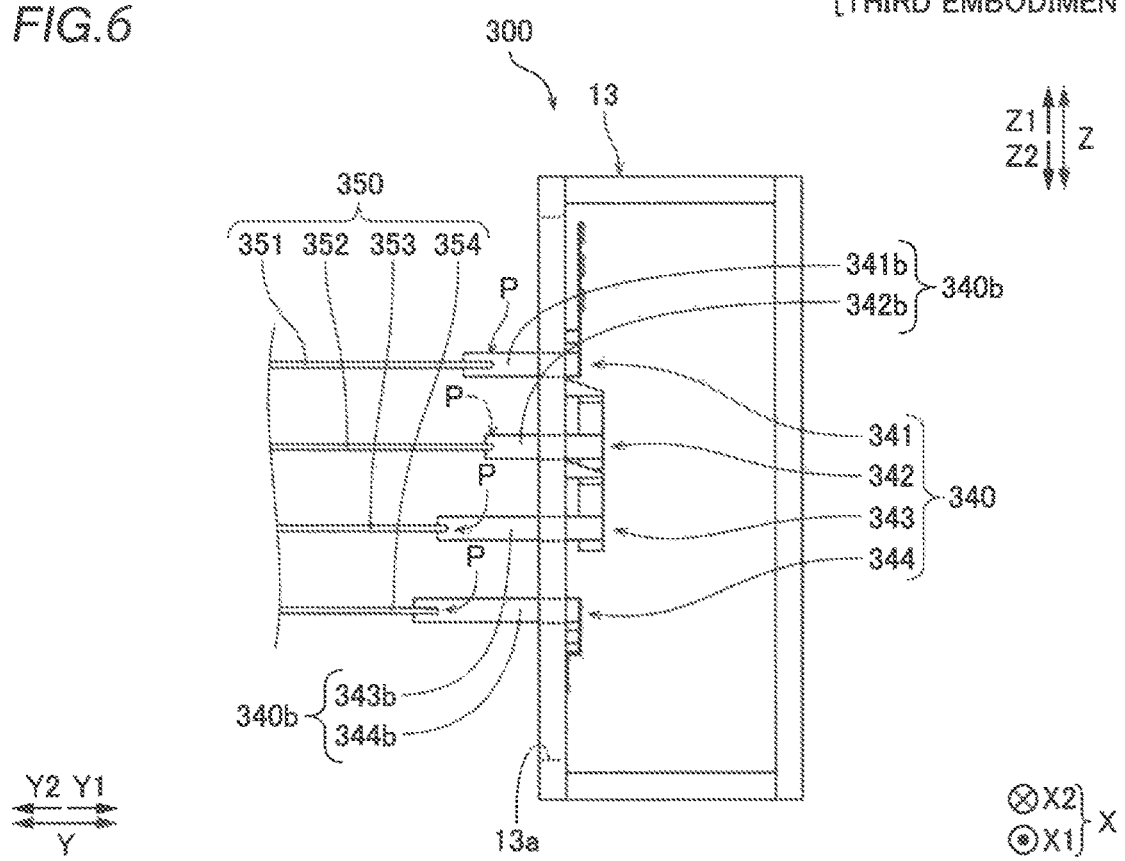
FIG.7 [FOURTH EMBODIMENT]
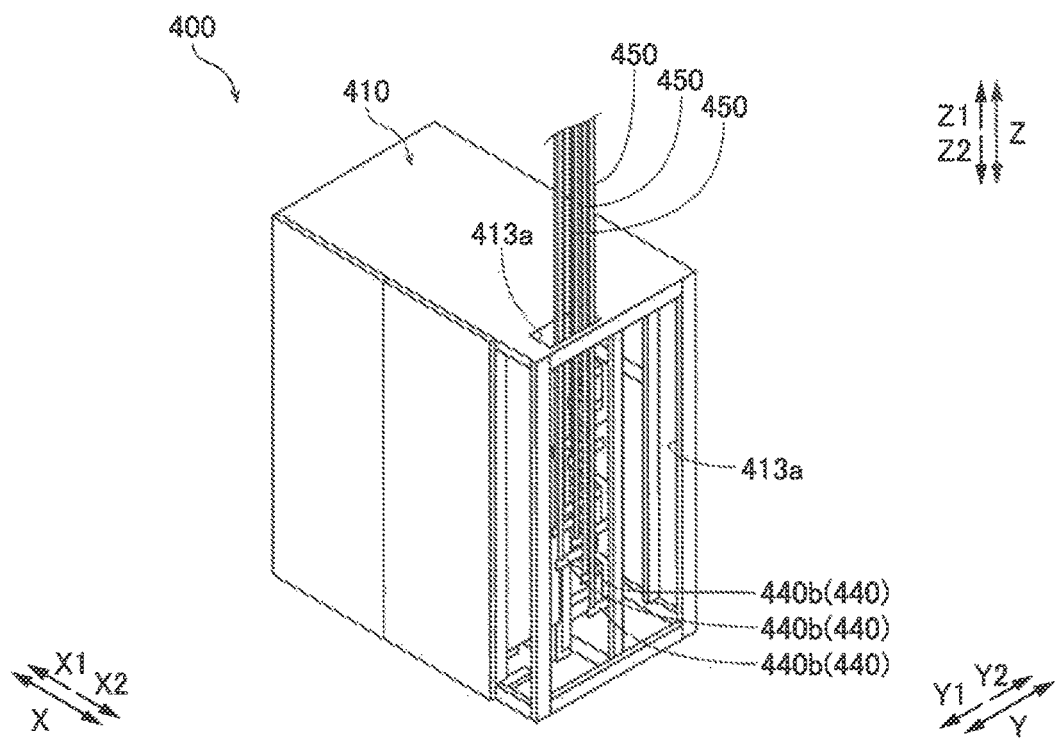

[FIFTH EMBODIMENT]

POWER CONVERTER DEVICE WITH NON-OVERLAPPING BUS BARS

CROSS-REFERENCE TO RELATED APPLICATION

This application is a continuation of PCT application PCT/JP2018/033753, filed on Sep. 12, 2018, which is based upon and claims priority of Japanese patent application No. 2017-219430, filed on Nov. 14, 2017, the entire contents of which are incorporated herein by reference.

BACKGROUND OF THE INVENTION

Field of the Invention

The present invention relates to a power conversion device, and more particularly, it relates to a power conversion device including a plurality of bus bars connected to external line cables.

Description of the Background Art

A switchboard including a plurality of terminals connected to external line cables is known in general. Such a power conversion device is disclosed in Japanese Patent Laid-Open No. 2004-120898, for example.

In Japanese Patent Laid-Open No. 2004-120898, a plurality of breakers is provided. The plurality of breakers is arranged in parallel along a vertical direction. Furthermore, a power-supply side bus bar is electrically connected to a power-supply side terminal of each of the plurality of breakers. Moreover, a load cable (external line cable) is connected to a load side terminal of each of the plurality of breakers. The load side terminals of the plurality of breakers are provided laterally (in a direction perpendicular to the vertical direction) to the breakers. That is, the load side terminals provided on the plurality of breakers arranged in parallel along the vertical direction are also arranged in parallel along the vertical direction.

In the switchboard disclosed in Japanese Patent Laid-Open No. 2004-120898, the load cable is connected to the load side terminal provided laterally to the breaker, and is pulled upward in a 90-degree bent state. The plurality of load side terminals is arranged in parallel along the vertical direction (that is, the plurality of load side terminals overlaps with each other as viewed from above), and thus the load cable connected to the load side terminal arranged on the lower side among the plurality of load side terminals is bent 90 degrees at a lateral position spaced apart from the load side terminal so as to avoid the load cable connected to the load side terminal arranged on the upper side among the plurality of load side terminals. That is, among the plurality of load side terminals, a lower load side terminal is bent 90 degrees at a lateral position spaced further apart from the load side terminal. Thus, interference between the load cables respectively connected to the plurality of load side terminals is significantly reduced or prevented.

However, in the switchboard disclosed in Japanese Patent Laid-Open No. 2004-120898, the load cable is connected to each of the load side terminals in a 90-degree bent state, and among the plurality of load side terminals, the lower load side terminal is bent 90 degrees at the lateral position spaced further apart from the load side terminal. Therefore, a space arranged for bending the load cable (external line cable) in the switchboard becomes relatively large, and thus the switchboard is increased in size. In a power conversion device that converts input AC power, even with a board structure having a relatively large power capacity, a space arranged for bending an external line cable in a board becomes relatively large similarly to the switchboard, and thus the device is disadvantageously increased in size. In addition, all the external line cables are bent 90 degrees, and thus stress is constantly applied to bent portions of the external line cables. Consequently, the life of the external line cables is disadvantageously shortened. In addition, the diameters of the external line cables increase as power supplied to a load increases, and thus it becomes difficult to bend the external line cables.

SUMMARY OF THE INVENTION

The present invention has been proposed in order to solve the aforementioned problems, and an object of the present invention is to provide a power conversion device, to which external line cables are connected, capable of significantly reducing or preventing an increase in its size while significantly reducing or preventing application of stress to the external line cables caused by bending of the external line cables.

In order to attain the aforementioned object, a power conversion device according to a first aspect of the present invention includes a power conversion module including at least an input-side switch into which AC power is input from an AC source, a power converter connected to the input-side switch, and an output-side switch to which the AC power is output from the power converter, a module storage housing that houses the power conversion module, and a plurality of bus bars connected to at least the input-side switch and the output-side switch of the power conversion module inside the module storage housing, the plurality of bus bars being connected to external line cables outside the module storage housing. Cable connection positions of connections in which the plurality of bus bars is respectively connected to the external line cables are non-overlapping with each other as viewed from a side on which the external line cables are pulled out.

In the power conversion device according to the first aspect of the present invention, as described above, the cable connection positions of the connections in which the plurality of bus bars is respectively connected to the external line cables are non-overlapping with each other as viewed from the side on which the external line cables are pulled out. Accordingly, a plurality of external line cables can be substantially linearly pulled out from the cable connection positions along a direction in which the external line cables are pulled out without interfering with each other. Consequently, the external line cables can be connected to the bus bars without being bent, and thus a space arranged for bending the external line cables becomes unnecessary. Thus, an increase in the size of the power conversion device to which the external line cables are connected can be significantly reduced or prevented. Furthermore, it is not necessary to bend the external line cables, and thus application of stress to the external line cables caused by bending of the external line cables is significantly reduced or prevented such that shortening of the life of the external line cables can be significantly reduced or prevented. In addition, it is not necessary to bend the external line cables, and thus the efficiency of the operation of connecting the external line cables to the bus bars can be improved, and the total length of each of the external line cables can be easily reduced.

In the aforementioned power conversion device according to the first aspect, the connections preferably include a plurality of sets of a plurality of connections aligned as one set in a first direction, which is a left-right direction of the module storage housing, the plurality of sets being aligned in a second direction, which is an upward-downward direction of the module storage housing, and when the external line cables are pulled out in the second direction or a third direction, the third direction being a depth direction of the module storage housing, the cable connection positions of the plurality of sets of the plurality of connections are preferably non-overlapping with each other as viewed in the second direction or the third direction, which is a direction in which the external line cables are pulled out. According to this configuration, when the external line cables are pulled out in the second direction or the third direction, the plurality of external line cables can be substantially linearly pulled out from the cable connection positions in the direction (the second direction or the third direction) in which the external line cables are pulled out without interfering with each other. Consequently, when the external line cables are pulled out in the second direction or the third direction, an increase in the size of the device can be significantly reduced or prevented while application of stress to the external line cables caused by bending of the external line cables is significantly reduced or prevented.

In the aforementioned power conversion device according to the first aspect, each of the plurality of bus bars preferably includes portions that extend in directions different from each other outside the module storage housing, and the portions that extend in the directions different from each other preferably include a portion that protrudes from an inside of the module storage housing to an outside of the module storage housing and a connection. According to this configuration, the efficiency of the operation of connecting the external line cables to the bus bars can be further improved by providing the connections that extend in a direction in which a worker can easily connect the external line cables to the connections.

In this case, the connection is preferably provided as a member separate from at least the portion that protrudes to the outside of the module storage housing, and is preferably attachable to and detachable from a portion of each of the plurality of bus bars other than the connection by a fastener. According to this configuration, the portion that protrudes from the inside of the module storage housing to the outside of the module storage housing and the connection can be more easily arranged in the directions different from each other.

In the aforementioned configuration in which the plurality of sets of the plurality of connections aligned as one set in the first direction is aligned in the second direction, the cable connections each preferably have a flat plate shape, and extend along the third direction. The power conversion device is often installed in contact with a wall in a room, and thus connections between the bus bars and the external line cables are performed on the front side of the power conversion device. In addition, the external line cables are fixed to the bus bars each having a flat plate shape by fasteners between which the flat plate-shaped bus bars are sandwiched from opposite sides, such as bolts and nuts. In this case, the worker needs to fasten the bolts to the nuts by a jig on first sides of the flat plate-shaped bus bars while fixing the nuts by a jig on second sides of the flat plate-shaped bus bars. That is, the worker connects the external line cables to the bus bars while holding the jigs in his or her both hands. When the connections extend in the first direction (laterally), for example, the worker needs to work with the jig by reaching around to the rear sides of the flat plate-shaped bus bars (opposite to the worker sides of the bus bars), and thus the workability is reduced. Therefore, as described above, when the connections extend along the third direction, the worker can connect the external line cables to the bus bars without reaching around to the sides opposite to the worker sides of the bus bars, and thus the efficiency of the operation of connecting the external line cables to the bus bars can be further improved.

In this case, the external line cables are preferably pulled upward in the second direction from the cable connection positions, and the connections preferably include a first connection disposed on an upper side in the second direction, a cable connection position of which is located at a first distance from a rear side of the module storage housing as viewed in the first direction, and a second connection disposed on a lower side in the second direction, a cable connection position of which is located at a second distance, which is larger than the first distance, from the rear side of the module storage housing as viewed in the first direction. According to this configuration, the cable connection position of the first connection is closer to the rear side of the module storage housing than the cable connection position of the second connection, as viewed in the first direction, and thus in the third direction, the end position of the first connection on the front side can be located on the rear side relative to the cable connection position of the second connection. Therefore, the external line cable connected to the cable connection position of the second connection and pulled upward in the second direction can be easily disposed so as not to interfere with the first connection disposed above the cable connection position of the second connection. Consequently, when the external line cables are pulled upward in the second direction, an increase in the size of the device can be reliably significantly reduced or prevented while application of stress to the external line cables caused by bending of the external line cables is significantly reduced or prevented.

In the aforementioned configuration in which the connections extend along the third direction, the external line cables are preferably pulled downward in the second direction from the cable connection positions, and the connections preferably include a third connection disposed on a lower side in the second direction, a cable connection position of which is located at a third distance from a rear side of the module storage housing as viewed in the first direction, and a fourth connection disposed on an upper side in the second direction, a cable connection position of which is located at a fourth distance, which is larger than the third distance, from the rear side of the module storage housing as viewed in the first direction. According to this configuration, the cable connection position of the third connection is closer to the rear side of the module storage housing than the cable connection position of the second connection, as viewed in the first direction, and thus in the third direction, the end position of the third connection on the front side can be located on the rear side relative to the cable connection position of the fourth connection. Therefore, the external line cable connected to the cable connection position of the fourth connection and pulled downward in the second direction can be easily disposed so as not to interfere with the third connection disposed below the cable connection position of the fourth connection. Consequently, when the external line cables are pulled downward in the second direction, an increase in the size of the device can be reliably significantly reduced or prevented while application of stress to the external line cables caused by bending of the external line cables is significantly reduced or prevented.

In the aforementioned configuration in which the connections extend along the third direction, the external line cables are preferably pulled rearward in the third direction from the cable connection positions, and the cable connection positions are preferably located on an end side opposite to a side on which the connections are connected to portions of the plurality of bus bars other than the connections in the connections. According to this configuration, as compared with the case in which the cable connection positions are located on the side on which the connections are connected to the portions of the bus bars other than the connections in the connections, the external line cables can be connected to the connections on the further rear side, and thus the total length of each of the external line cables can be more easily reduced.

A power conversion device according to a second aspect of the present invention includes a power conversion module including at least an input-side switch into which AC power is input from an AC source, a power converter connected to the input-side switch, and an output-side switch to which the AC power is output from the power converter, a module storage housing that houses the power conversion module, a plurality of bus bars connected to at least the input-side switch and the output-side switch of the power conversion module inside the module storage housing, the plurality of bus bars being connected to external line cables outside the module storage housing, and an external line connection cabinet that houses two or more connections in which the plurality of bus bars is respectively connected to the external line cables, the external line connection cabinet including an external line cable outlet through which the external line cables are pulled out. Cable connection positions of the two or more connections are non-overlapping with each other as viewed from the external line cable outlet.

As described above, the power conversion device according to the second aspect of the present invention includes the external line connection cabinet that houses the two or more connections in which the plurality of bus bars is respectively connected to the external line cables, and including the external line cable outlet through which the external line cables are pulled out. Furthermore, the cable connection positions of the two or more connections are non-overlapping with each other as viewed from the external line cable outlet. Accordingly, a plurality of external line cables can be substantially linearly pulled out via the external line cable outlet provided in the external line connection cabinet along a direction in which the external line cables are pulled out from the cable connection positions without interfering with each other. Consequently, the external line cables can be connected to the bus bars without being bent, and thus in the external line connection cabinet in which the cable connection positions are located, a space arranged for bending the external line cables becomes unnecessary. Thus, an increase in the size of the power conversion device to which the external line cables are connected can be significantly reduced or prevented. Furthermore, it is not necessary to bend the external line cables, and thus application of stress to the external line cables caused by bending of the external line cables is significantly reduced or prevented such that shortening of the life of the external line cables can be significantly reduced or prevented. In addition, it is not necessary to bend the external line cables, and thus the efficiency of the operation of connecting the external line cables to the bus bars can be improved, and the total length of each of the external line cables can be easily reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4(a) is a diagram showing the bus bars and the external line cables as viewed from the side, and FIG. 4(b) is a diagram showing the bus bars and the external line cables as viewed from the front;

FIG. 5(a) is a diagram showing bus bars and external line cables in a power conversion device according to a second embodiment of the present invention as viewed from the side, and FIG. 5(b) is a diagram showing the bus bars and the external line cables in the power conversion device according to the second embodiment of the present invention as viewed from the front;

FIG. 6 is a diagram showing bus bars and external line cables in a power conversion device according to a third embodiment of the present invention as viewed from the side;

FIG. 7 is a perspective view showing the overall configuration of a power conversion device according to a fourth embodiment of the present invention;

DESCRIPTION OF THE PREFERRED EMBODIMENTS

Embodiments of the present invention are hereinafter described with reference to the drawings.

First Embodiment

The overall configuration of a power conversion device 100 according to a first embodiment of the present invention is now described with reference to FIGS. 1 and 2. The power conversion device 100 is an uninterruptible power supply (UPS) or a power conditioning system (PCS) installed in a data center, for example.

(Configuration of Power Conversion Device)

Figure 1:
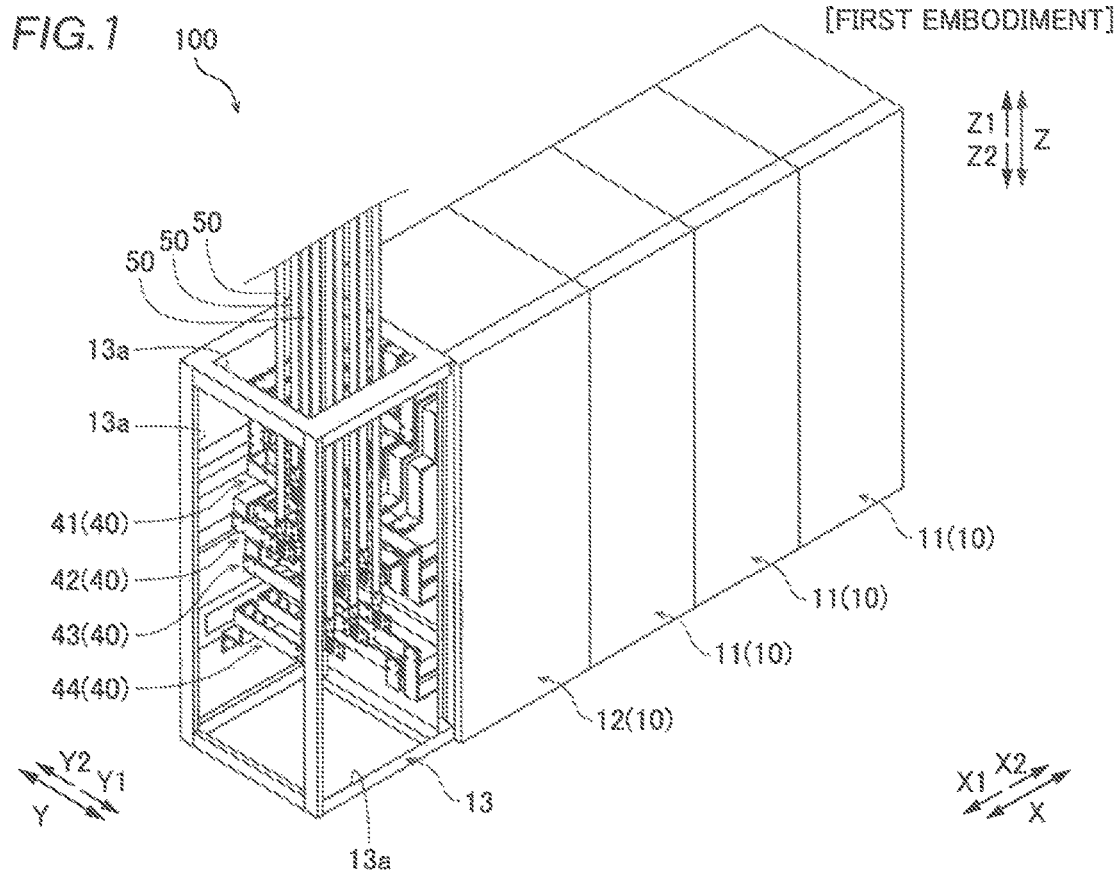
FIG. 1 is a perspective view showing the overall configuration of a power conversion device according to a first embodiment of the present invention.

As shown in FIG. 1, in the power conversion device 100, a plurality of housings 10 is arranged adjacent to each other in a row. The plurality of housings 10 includes a plurality of housings 11 in which power conversion modules 20 (see FIG. 2) are housed and a housing 12 in which a control module 30 (see FIG. 2) is housed. In addition, the power conversion device 100 includes an external line connection cabinet 13 in which bus bars 40 that connect portions to each other inside the plurality of housings 10 and external line cables 50 pulled out of the power conversion device 100 are connected to each other. In the power conversion device 100, the external line connection cabinet 13, the housing 12, and the three housings 11 are aligned in this order in the left-right direction of the housings 10. The housings 10 are examples of a "module storage housing" in the claims.

In this specification, the left-right direction (first direction), the upward-downward direction (second direction), and the forward-rearward direction (third direction) of the housings 10 are taken as an X direction, a Z direction, and a Y direction, respectively. In addition, the left direction, the right direction, the upward direction (upper side), the downward direction (lower side), the forward direction (front, front side), and the rearward direction (rear, rear side) of the housings 10 are taken as an X1 direction, an X2 direction, a Z1 direction, a Z2 direction, a Y1 direction, and a Y2 direction, respectively.

Figure 2:
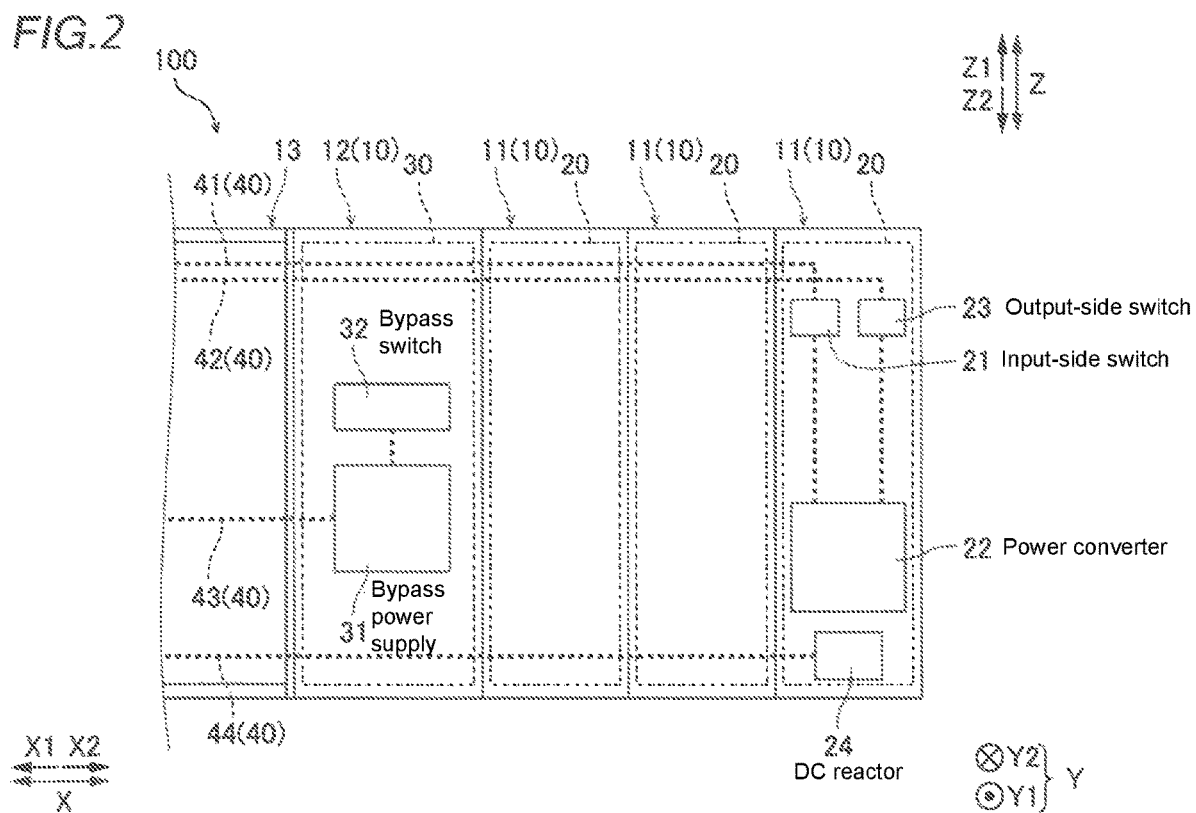
FIG. 2 is a front view schematically showing a power conversion module in the power conversion device according to the first embodiment of the present invention.

As shown in FIG. 2, the power conversion modules 20 each include an input-side switch 21, a power converter 22, an output-side switch 23, and a DC reactor 24. The input-side switch 21, the power converter 22, and the output-side switch 23 are configured as a three-phase AC circuit.

AC power is input from an AC source (not shown) outside the power conversion device 100 into the input-side switch 21 via the external line cables 50 (external line cables 51 (see FIG. 3)) and the bus bars 40 (bus bars 41). The power converter 22 is connected to the input-side switch 21 via an input filter (not shown). The power converter 22 includes a rectifier circuit, a chopper circuit, and an inverter circuit, and converts the voltage of AC power. The output-side switch 23 is connected to the power converter 22 via an output filter (not shown). The output-side switch 23 outputs the AC power converted by the power converter 22 to the outside of the power conversion device 100 via the bus bars 40 (bus bars 42) and the external line cables 50 (external line cables 52 (see FIG. 3)).

The DC reactor 24 is connected to the chopper circuit of the power converter 22 via a bus bar (not shown). The DC reactor 24 stores DC power, the voltage of which has been changed by the chopper circuit, in a battery (not shown) provided outside the power conversion device 100 via the bus bars 40 (bus bars 44) and the external line cables 50 (external line cables 54 (see FIG. 3)).

The control module 30 includes a bypass power supply 31 and a bypass switch 32. The bypass power supply 31 and the bypass switch 32 are configured as a bypass circuit of the power conversion circuit formed by the power conversion module 20 (the input-side switch 21, the power converter 22, and the output-side switch 23). The bypass switch 32 switches between the power conversion circuit formed by the power conversion module 20 and the bypass circuit. Specifically, AC power is input from the AC source outside the power conversion device 100 into the bypass power supply 31 via the external line cables 50 (external line cables 53 (see FIG. 3)) and the bus bars 40 (bus bars 43). The AC power input into the bypass power supply 31 is output to the outside of the power conversion device 100 via the bypass switch 32, a bus bar (not shown) that extends upward from the bypass switch 32, and the bus bars 40 (bus bars 42). A control panel (not shown) is provided on the front side (Y1 side) of the control module 30 to check and set the state and operation of the power conversion device 100.

The external line connection cabinet 13 houses a plurality of connections 40b (see FIG. 3) in which the plurality of bus bars 40 is respectively connected to the external line cables 50. In addition, the external line connection cabinet 13 is provided with a plurality of external line cable outlets 13a through which the external line cables 50 are pulled out of the power conversion device 100.

(Connection Structure Between Bus Bar and External Line Cable)

Connection structures between the bus bars 40 and the external line cables 50 are now described with reference to FIGS. 1, 3, and 4.

Figure 3:
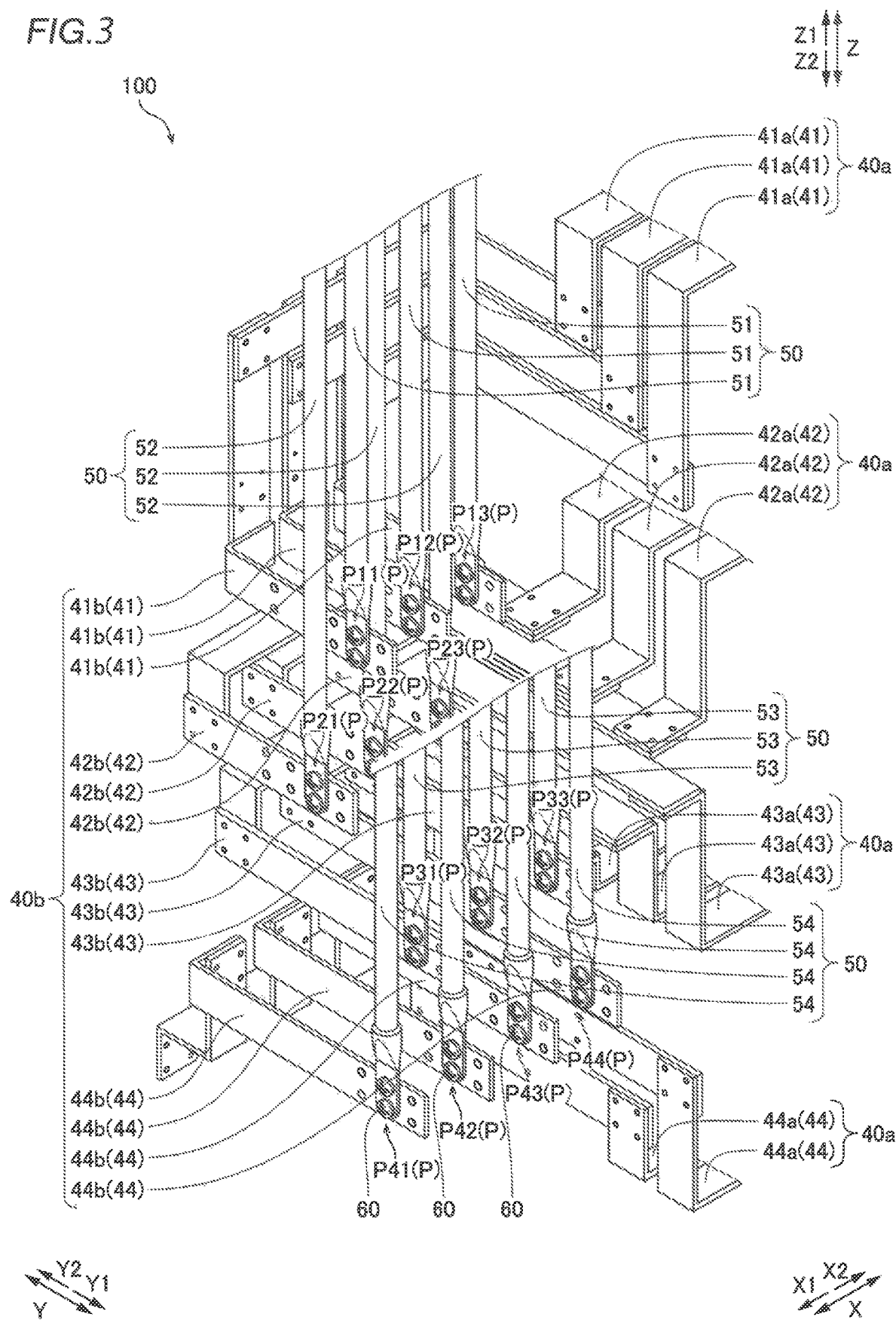
FIG. 3 is an enlarged perspective view of bus bars and external line cables in the power conversion device according to the first embodiment of the present invention.

As shown in FIG. 3, the bus bars 40 include the bus bars 41 connected to the input-side switches 21, the bus bars 42 connected to the output-side switches 23, the bus bars 43 connected to the bypass power supply 31, and the bus bars 44 connected to the DC reactors 24. The external line cables 50 include the external line cables 51, 52, 53, and 54 connected to the bus bars 41, 42, 43, and 44, respectively. In the first embodiment, the external line cables 50 (51, 52, 53, 54) are pulled upward (in the Z1 direction) from cable connection positions P at which the connections 40b and the external line cables 50 are connected to each other. In addition, as shown in FIG. 1, in the first embodiment, the external line cables 50 are pulled out of the power conversion device 100 via the external line cable outlet 13a provided on the upper side (Z1 side) of the external line connection cabinet 13.

As shown in FIG. 3, in the first embodiment, the bus bars 40 include portions that extend in directions different from each other outside the housings 10. Specifically, the bus bars 40 are each made of a flat plate-shaped member that extends in the X direction, the Y direction, or the Z direction in the external line connection cabinet 13. The bus bars 40 each extend while changing the orientation by either bending the flat plate-shaped member or fixing the flat plate-shaped members to each other.

In the first embodiment, the portions that extend in the directions different from each other include portions 40a of the bus bars 40 that protrude from the inside of the housings 10 to the outside of the housings 10, and connections 40b in which the bus bars 40 are respectively connected to the external line cables 50. Furthermore, in the first embodiment, the connections 40b each have a flat plate shape, and extend along the Y direction.

Specifically, the bus bars 40 each include the portion 40a that protrudes from the inside of the housings 10 to the outside of the housings 10 and the connection 40b connected to the external line cable 50. The portion 40a that protrudes to the outside of the housings 10 protrudes from the inside of the housings 10 to the outside of the housings 10 in the X1 direction so as to extend in the X direction. The connection 40b has a flat plate shape so as to extend in the Y direction (a direction different from a direction in which the portion 40a protrudes to the outside of the housings 10). The connections 40b are respectively connected to the external line cables 50 at the predetermined cable connection positions P. In the first embodiment, the external line cables 50 are fixed in the vicinity of the tips of the external line cables 50 by bolts 60 and nuts (not shown) in such a manner that the tips of the external line cables 50 and the connections 40b having main surfaces substantially perpendicular to the X direction are sandwiched from the X1 direction side and the X2 direction side.

In the first embodiment, the connections 40b are provided as members separate from the portions 40a that protrude to the outside of the housings 10, and are attachable to and detachable from portions of the bus bars 40 other than the connections 40b by fasteners. Specifically, the connections 40b are attachable to and detachable from the other flat plate-shaped portions of the bus bars 40 by the fasteners (not shown) (bolts and nuts, for example) at Y2 side ends of the connections 40b that extend in the Y direction. In the power conversion device 100, the Y2 side ends of the connections 40b, in which the connections 40b are connected to the other flat plate-shaped portions of the bus bars 40, are arranged in the vicinity of the rear sides (Y2 sides) of the housings 10, as viewed in the X direction.

In the first embodiment, a plurality of connections 40b is aligned as one set in the X direction, and a plurality of sets of the plurality of connections 40b as one set is aligned in the Z direction. Specifically, three connections 41b of the bus bars 41, three connections 42b of the bus bars 42, and three connections 43b of the bus bars 43 are aligned in the X direction, corresponding to the three-phase AC circuit. Furthermore, four connections 44b of the bus bars 44, two of which correspond to a positive electrode and the other two of which correspond to a negative electrode, are aligned in the X direction. One set of three connections 41b, one set of three connections 42b, one set of three connections 43b, and one set of four connections 44b, which are four sets in total, are aligned in this order in the Z direction from the upper side (Z1 direction side) toward the lower side (Z2 direction side). The connections 41b, the connections 42b, the connections 43b, and the connections 44b are examples of a "first connection", a "second connection", a "third connection", and a "fourth connection" in the claims, respectively.

In the first embodiment, the cable connection positions P of the four sets of connections 40b are non-overlapping with each other as viewed from the side (upper side, Z1 direction side) on which the external line cables 50 are pulled out. Specifically, in the first embodiment, among the connections 40b, the connections 41b and 42b are disposed on the Z1 side (upper side) in the Z direction, and the cable connection positions P thereof are located at a distance R1 from the rear sides (Y2 sides) of the housings 10 as viewed in the X direction. Among the connections 40b, the connections 43b and 44b are disposed on the Z2 side (lower side) in the Z direction, and the cable connection positions P thereof are located at a distance R2, which is larger than the distance R1, from the rear sides (Y2 sides) of the housings 10 as viewed in the X direction. The distance R1 and the distance R2 are examples of a "first distance" and a "second distance" in the claims, respectively.

More specifically, as shown in FIG. 3, cable connection positions P11, P12 and P13 of the three connections 41b aligned in the X direction and cable connection positions P21, P22 and P23 of the three connections 42b aligned in the X direction are alternately spaced apart from each other in the X direction. That is, the cable connection positions P11, P12, P13, P21, P22, and P23 are non-overlapping with each other as viewed from the Z1 direction side. Therefore, a total of six external line cables 50, which are three external line cables 51 and three external line cables 52 connected to the cable connection positions P11, P12, P13, P21, P22, and P23, can be pulled upward without interfering with each other.

As shown in FIGS. 3 and 4(b), cable connection positions P31, P32, and P33 of the three connections 43b aligned in the X direction and cable connection positions P41, P42, P43, and P44 of the four connections 44b aligned in the X direction are alternately spaced apart from each other in the X direction. That is, the cable connection positions P31, P32, P33, P41, P42, P43, and P44 are non-overlapping with each other as viewed from the Z1 direction side. Therefore, a total of seven external line cables 50, which are three external line cables 53 and four external line cables 54 connected to the cable connection positions P31, P32, P33, P41, P42, P43, and P44, can be pulled upward without interfering with each other.

As shown in FIG. 4(a), the cable connection position P11 (P12, P13) of the connection 41b and the cable connection position P21 (P22, P23) of the connection 42b are located at the distance R1 as viewed in the X direction. Furthermore, the cable connection position P31 (P32, P33) of the connection 43b and the cable connection position P41 (P42, P43, P44) of the connection 44b are located at the distance R2, which is larger than the distance R1, as viewed in the X direction. That is, the cable connection positions P11, P12, P13, P21, P22, and P23 and the cable connection positions P31, P32, P33, P41, P42, P43, and P44 are spaced apart in the Z direction so as not to overlap with each other. The cable connection positions P11, P12, P13, P21, P22, and P23 located on the upper side (Z1 side) are located on the Y2 side relative to the cable connection positions P31, P32, P33, P41, P42, P43, and P44 located on the lower side (Z2 side), and thus the external line cables 50 connected to the cable connection positions P31, P32, P33, P41, P42, and P44 located on the lower side (Z2 side) can be substantially linearly pulled upward (in the Z1 direction) without interfering with the connections 41b and 42b. Thus, the six external line cables 50 (the three external line cables 51 and the three external line cables 52) connected to the cable connection positions P11, P12, P13, P21, P22, and P23 and the seven external line cables (the three external line cables 53 and the four external line cables 54) connected to the cable connection positions P31, P32, P33, P41, P42, P43, and P44 can be substantially linearly pulled upward (in the Z1 direction) without overlapping with each other. A width between the cable connection positions P is larger than the width (diameter) of the external line cable 50.

Advantageous Effects of First Embodiment

According to the first embodiment, the following advantageous effects are achieved.

According to the first embodiment, as described above, the cable connection positions P of the connections 40b in which the plurality of bus bars 40 is respectively connected to the external line cables 50 are non-overlapping with each other as viewed from the side (in the Z direction) on which the external line cables 50 are pulled out. Accordingly, the plurality of external line cables 50 can be substantially linearly pulled out from the cable connection positions P along the direction (Z direction) in which the external line cables 50 are pulled out without interfering with each other. Consequently, the external line cables 50 can be connected to the bus bars 40 without being bent, and thus a space arranged for bending the external line cables 50 becomes unnecessary. Thus, an increase in the size of the power conversion device 100 to which the external line cables 50 are connected can be significantly reduced or prevented. Furthermore, it is not necessary to bend the external line cables 50, and thus application of stress to the external line cables 50 caused by bending of the external line cables 50 is significantly reduced or prevented such that shortening of the life of the external line cables 50 can be significantly reduced or prevented. In addition, it is not necessary to bend the external line cables 50, and thus the efficiency of the operation of connecting the external line cables 50 to the bus bars 40 can be improved, and the total length of each of the external line cables 50 can be easily reduced.

According to the first embodiment, as described above, the plurality of connections 40b is aligned as one set in the X direction, which is the left-right direction of the housings 10. Furthermore, the plurality of sets of the plurality of connections 40b as one set is aligned in the Z direction, which is the upward-downward direction of the housings 10. In addition, when the external line cables 50 are pulled out in the Z direction, the cable connection positions P of the plurality of sets of the plurality of connections 40b are non-overlapping with each other as viewed in the Z direction, which is the direction in which the external line cables 50 are pulled out. Accordingly, when the external line cables 50 are pulled out in the Z direction, the plurality of external line cables 50 can be substantially linearly pulled out from the cable connection positions P in the direction (Z direction) in which the external line cables 50 are pulled out without interfering with each other. Consequently, when the external line cables are pulled out in the upward-downward direction (Z direction), an increase in the size of the device can be significantly reduced or prevented while application of stress to the external line cables 50 caused by bending of the external line cables 50 is significantly reduced or prevented.

According to the first embodiment, as described above, each of the plurality of bus bars 40 includes the portions that extend in the directions different from each other outside the housings 10, and the portions that extend in the directions different from each other include the portion 40a that protrudes from the inside of the housings 10 to the outside of the housings 10 and the connection 40b. Accordingly, the efficiency of the operation of connecting the external line cables 50 to the bus bars 40 can be further improved by providing the connections 40b that extend in a direction in which a worker can easily connect the external line cables 50 to the connections 40b.

According to the first embodiment, as described above, the connections 40b are provided as members separate from the portions 40a that protrude to the outside of the housings 10, and are attachable to and detachable from the portions of the bus bars 40 other than the connections 40b by the fasteners. Accordingly, the portions 40a that protrude from the inside of the housings 10 to the outside of the housings 10 and the connections 40b can be more easily arranged in the directions different from each other.

According to the first embodiment, as described above, the connections 40b each have a flat plate shape, and extend along the Y direction. The power conversion device 100 is often installed in contact with a wall in a room, and thus connections between the bus bars 40 and the external line cables 50 are performed on the front side (Y1 side) of the power conversion device 100. In addition, the external line cables 50 are fixed to the bus bars 40 each having a flat plate shape by the fasteners between which the flat plate-shaped bus bars 40 are sandwiched from opposite sides, such as the bolts 60 and the nuts. In this case, the worker needs to fasten the bolts 60 to the nuts by a jig on first sides of the flat plate-shaped bus bars 40 while fixing the nuts by a jig on second sides of the flat plate-shaped bus bars 40. That is, the worker connects the external line cables 50 to the bus bars 40 while holding the jig in his or her both hands. When the connections 40b extend in the X direction (laterally), for example, the worker needs to work with the jig by reaching around to the rear sides (Y2 sides) of the flat plate-shaped bus bars 40 (opposite to the worker sides (Y1 sides) of the bus bars), and thus the workability is reduced. Therefore, as described above, when the connections 40b extend along the Y direction, the worker can connect the external line cables 50 to the bus bars 40 without reaching around to the sides (Y2 sides) opposite to the worker sides (Y1 sides) of the bus bars 40, and thus the efficiency of the operation of connecting the external line cables 50 to the bus bars 40 can be further improved.

According to the first embodiment, as described above, the external line cables 50 (51, 52, 53, 54) are pulled upward in the Z direction from the cable connection positions P. Furthermore, the connections 40b include the connections 41b and 42b disposed on the upper side in the Z direction, the cable connection positions P of which are located at the distance R1 from the rear sides (Y2 sides) of the housings 10 as viewed in the X direction, and the connections 43b and 44b disposed on the lower side in the Z direction, the cable connection positions P of which are located at the distance R2, which is larger than the distance R1, from the rear sides (Y2 sides) of the housings 10 as viewed in the X direction. Accordingly, the cable connection positions P of the connections 41b and 42b are closer to the rear sides (Y2 sides) of the housings 10 than the cable connection positions P of the connections 43b and 44b, as viewed in the X direction, and thus in the Y direction, the end positions of the connections 41b and 42b on the front side (Y1 side) can be located on the rear side (Y2 side) relative to the cable connection positions P of the connections 43b and 44b. Therefore, the external line cables 53 and 54 connected to the cable connection positions P of the connections 43b and 44b and pulled upward in the Z direction can be easily disposed so as not to interfere with the connections 41b and 42b disposed above the cable connection positions P of the connections 43b and 44b. Consequently, when the external line cables 50 are pulled upward in the Z direction, an increase in the size of the device can be reliably significantly reduced or prevented while application of stress to the external line cables 50 caused by bending of the external line cables 50 is significantly reduced or prevented.

According to the first embodiment, as described above, the power conversion device 100 includes the external line connection cabinet 13 that houses the two or more connections 40b in which the plurality of bus bars 40 is respectively connected to the external line cables 50, and including the external line cable outlet 13a through which the external line cables 50 are pulled out of the power conversion device 100. Furthermore, the cable connection positions P of the connections 40b are unaligned so as to be non-overlapping with each other as viewed from the external line cable outlet 13a. Accordingly, the plurality of external line cables 50 can be substantially linearly pulled out via the external line cable outlet 13a provided in the external line connection cabinet 13 along the direction (Z direction) in which the external line cables 50 are pulled out from the cable connection positions P without interfering with each other. Consequently, the external line cables 50 can be connected to the bus bars 40 without being bent, and thus in the external line connection cabinet 13 in which the cable connection positions P are located, a space arranged for bending the external line cables 50 becomes unnecessary. Thus, an increase in the size of the power conversion device 100 to which the external line cables 50 are connected can be significantly reduced or prevented. Furthermore, it is not necessary to bend the external line cables 50, and thus application of stress to the external line cables 50 caused by bending of the external line cables 50 is significantly reduced or prevented such that shortening of the life of the external line cables 50 can be significantly reduced or prevented. In addition, it is not necessary to bend the external line cables 50, and thus the efficiency of the operation of connecting the external line cables 50 to the bus bars 40 can be improved, and the total length of each of the external line cables 50 can be easily reduced.

Second Embodiment

A second embodiment of the present invention is now described with reference to FIG. 5. In this second embodiment, external line cables 250 are pulled downward, unlike the first embodiment in which the external line cables 50 are pulled upward. In the figure, the same structures as those of the first embodiment are denoted by the same reference numerals.

In a power conversion device 200 according to the second embodiment of the present invention, as shown in FIG. 5, bus bars 240 and the external line cables 250 pulled downward (in a Z2 direction) are connected to each other in an external line connection cabinet 13. The bus bars 240 include bus bars 241, 242, 243, and 244 corresponding to the bus bars 41, 42, 43, and 44 according to the first embodiment. In the second embodiment, the external line cables 250 are pulled out of the power conversion device 200 via an external line cable outlet 13a provided on the lower side (Z2 side) of the external line connection cabinet 13.

Specifically, the bus bars 241, 242, 243, and 244 are connected to an input-side switch, an output-side switch, a bypass power supply, and a DC reactor, respectively. As shown in FIGS. 5(a) and 5(b), the bus bars 241, 242, 243, and 244 include connections 240b (connections 241b, 242b, 243b, and 244b) connected to the external line cables 250 (251, 252, 253, and 254), respectively. The connections 241b, 242b, 243b, and 244b are examples of a "first connection", a "second connection", a "third connection", and a "fourth connection" in the claims, respectively.

In the power conversion device 200, the connections 240b include one set of three connections 241b, one set of three connections 242b, one set of three connections 243b, and one set of four connections 244b, which are four sets in total, aligned in this order in a Z direction from the upper side (Z1 direction side) toward the lower side (Z2 direction side).

In the second embodiment, the cable connection positions P of the four sets of connections 240b are non-overlapping with each other as viewed from the side (lower side, Z2 direction side) on which the external line cables 250 are pulled out. Specifically, in the second embodiment, among the connections 240b, the connections 243b and 244b are disposed on the Z2 side (lower side) in the Z direction, and the cable connection positions P thereof are located at a distance R1 from the rear sides (Y2 sides) of housings 10 as viewed in an X direction. Among the connections 240b, the connections 241b and 242b are disposed on the Z1 side (upper side) in the Z direction, and the cable connection positions P thereof are located at a distance R2, which is larger than the distance R1, from the rear sides (Y2 sides) of the housings 10 as viewed in the X direction.

More specifically, as shown in FIG. 5, cable connection positions P211, P212 and P213 of the three connections 241b aligned in the X direction and cable connection positions P221, P222 and P223 of the three connections 242b aligned in the X direction are alternately spaced apart from each other in the X direction. That is, the cable connection positions P211, P212, P213, P221, P222, and P223 are non-overlapping with each other as viewed from the Z2 direction side. Therefore, a total of six external line cables 250, which are three external line cables 251 and three external line cables 252 connected to the cable connection positions P211, P212, P213, P221, P222, and P223, can be pulled downward without interfering with each other.

As shown in FIG. 5(b), cable connection positions P231, P232, and P233 of the three connections 243b aligned in the X direction and cable connection positions P241, P242, P243, and P244 of the four connections 244b aligned in the X direction are alternately spaced apart from each other in the X direction. That is, the cable connection positions P231, P232, P233, P241, P242, P243, and P244 are non-overlapping with each other as viewed from the Z2 direction side. Therefore, a total of seven external line cables 250, which are three external line cables 253 and four external line cables 254 connected to the cable connection positions P231, P232, P233, P241, P242, P243, and P244, can be pulled downward without interfering with each other.

As shown in FIG. 5(a), the cable connection position P231 (P232, P233) of the connection 243b and the cable connection position P241 (P242, P243, P244) of the connection 244b are located at the distance R1 as viewed in the X direction. Furthermore, the cable connection position P211 (P212, P213) of the connection 241b and the cable connection position P221 (P222, P223) of the connection 242b are located at the distance R2, which is larger than the distance R1, as viewed in the X direction. That is, the cable connection positions P211, P212, P213, P221, P222, and P223 and the cable connection positions P231, P232, P233, P241, P242, P243, and P244 are spaced apart in the Z direction so as not to overlap with each other. The cable connection positions P231, P232, P233, P241, P242, P243, and P244 located on the lower side (Z2 side) are located on the Y2 side relative to the cable connection positions P211, P212, P213, P221, P222, and P223 located on the upper side (Z1 side), and thus the external line cables 250 connected to the cable connection positions P211, P212, P213, P221, P222, and P223 located on the upper side (Z1 side) can be substantially linearly pulled downward (in the Z2 direction) without interfering with the connections 243b and 244b. Thus, the six external line cables 250 (the three external line cables 251 and the three external line cables 252) connected to the cable connection positions P211, P212, P213, P221, P222, and P223 and the seven external line cables (the three external line cables 253 and the four external line cables 254) connected to the cable connection positions P231, P232, P233, P241, P242, P243, and P244 can be substantially linearly pulled downward (in the Z2 direction) without overlapping with each other.

The remaining structures of the second embodiment are similar to those of the first embodiment.

Advantageous Effects of Second Embodiment

According to the second embodiment, the following advantageous effects are achieved.

According to the second embodiment, as described above, the external line cables 250 (251, 252, 253, 254) are pulled downward in the Z direction from the cable connection positions. Furthermore, the connections 240b include the connections 243b and 244b disposed on the lower side in the Z direction, the cable connection positions P of which are located at the distance R1 from the rear sides (Y2 sides) of the housings 10 as viewed in the X direction, and the connections 241b and 242b disposed on the upper side in the Z direction, the cable connection positions P of which are located at the distance R2, which is larger than the distance R1, from the rear sides (Y2 sides) of the housings 10 as viewed in the X direction. Accordingly, the cable connection positions P of the connections 243b and 244b are closer to the rear sides (Y2 sides) of the housings 10 than the cable connection positions P of the connections 241b and 242b, as viewed in the X direction, and thus in the Y direction, the end positions of the connections 243b and 244b on the front side (Y1 side) can be located on the rear side (Y2 side) relative to the cable connection positions P of the connections 241b and 242b. Therefore, the external line cables 251 and 252 connected to the cable connection positions P of the connections 241b and 242b and pulled downward in the Z direction can be easily disposed so as not to interfere with the connections 243b and 244b disposed below the cable connection positions P of the connections 241b and 242b. Consequently, when the external line cables 250 are pulled downward in the Z direction, an increase in the size of the device can be reliably significantly reduced or prevented while application of stress to the external line cables 250 caused by bending of the external line cables 250 is significantly reduced or prevented.

The remaining advantageous effects of the second embodiment are similar to those of the first embodiment.

Third Embodiment

A third embodiment of the present invention is now described with reference to FIG. 6. In this third embodiment, external line cables 350 are pulled rearward, unlike the first embodiment in which the external line cables 50 are pulled upward and the second embodiment in which the external line cables 250 are pulled downward. In the figure, the same structures as those of the first embodiment are denoted by the same reference numerals.

In a power conversion device 300 according to the third embodiment of the present invention, as shown in FIG. 6, bus bars 340 and the external line cables 350 pulled rearward (in a Y2 direction) are connected to each other in an external line connection cabinet 13. The bus bars 340 include bus bars 341, 342, 343, and 344 corresponding to the bus bars 41, 42, 43, and 44 according to the first embodiment. In the third embodiment, the external line cables 350 are pulled out of the power conversion device 300 via an external line cable outlet 13a provided on the rear side (Y2 side) of the external line connection cabinet 13.

Specifically, the bus bars 341, 342, 343, and 344 are connected to an input-side switch, an output-side switch, a bypass power supply, and a DC reactor, respectively. As shown in FIG. 6, the bus bars 341, 342, 343, and 344 include connections 340b (connections 341b, 342b, 343b, and 344b) connected to the external line cables 350 (351, 352, 353, and 354), respectively. The connections 341b, 342b, 343b, and 344b are examples of a "first connection", a "second connection", a "third connection", and a "fourth connection" in the claims, respectively.

In the third embodiment, a plurality of connections 340b is aligned as one set in an X direction, a plurality of sets of the plurality of connections 340b as one set is aligned in a Z direction, and the cable connection positions P of the plurality of sets of the plurality of connections 340b are non-overlapping with each other as viewed from in a Y direction, which is a direction in which the external line cables 350 are pulled out.

Specifically, in the power conversion device 300, the connections 340b include one set of three connections 341b aligned in the X direction, one set of three connections 342b aligned in the X direction, one set of three connections 343b aligned in the X direction, and one set of four connections 344b aligned in the X direction, which are four sets in total, aligned in this order in the Z direction from the upper side (Z1 direction side) toward the lower side (Z2 direction side). That is, a total of thirteen cable connection positions P of the external line cables 350 (351, 352, 353, and 354) connected to the connections 340b (341b, 342b, 343b, and 344b) are non-overlapping with each other as viewed in the Y direction. Thus, the thirteen external line cables 350 connected to the cable connection positions P can be substantially linearly pulled rearward (in the Y2 direction) without overlapping with each other.

In the third embodiment, the cable connection positions P are located on the end side (Y2 side) opposite to the side (Y1 side) on which the connections 340b are connected to portions of the bus bars 340 other than the connections 340b in the connections 340b. Specifically, the connections 340b are connected to the portions of the bus bars 340 other than the connections 340b in the vicinity of ends of the connections 340b on the Y1 side. The connections 340b are connected to the external line cables 350 at the cable connection positions P in the vicinity of ends of the connections 340b on the Y2 side. In the power conversion device 300, the ends of the connections 340b on the Y1 side are disposed in the vicinity of the rear sides (Y2 sides) of housings 10 as viewed in the X direction, and thus the cable connection positions P of the external line cables 350 are located on the rear side (Y2 side) relative to the housings 10.

The remaining structures of the third embodiment are similar to those of the first embodiment.

Advantageous Effects of Third Embodiment

According to the third embodiment, the following advantageous effects are achieved.

According to the third embodiment, as described above, the cable connection positions P of the connections 340b in which a plurality of bus bars 340 is respectively connected to the external line cables 350 are non-overlapping with each other as viewed from the side (in the Y direction) on which the external line cables 350 are pulled out. Accordingly, a plurality of external line cables 350 can be substantially linearly pulled out from the cable connection positions P along the direction (Y direction) in which the external line cables 350 are pulled out without interfering with each other. Consequently, similarly to the first embodiment, an increase in the size of the device can be significantly reduced or prevented, and shortening of the life of the external line cables 350 can be significantly reduced or prevented. Furthermore, the efficiency of the operation of connecting the external line cables 350 to the bus bars 340 can be improved, and the total length of each of the external line cables 350 can be easily reduced.

According to the third embodiment, as described above, the plurality of connections 340b is aligned as one set in the X direction, which is the left-right direction of the housings 10. Furthermore, the plurality of sets of the plurality of connections 340b as one set is aligned in the Z direction, which is the upward-downward direction of the housings 10. In addition, when the external line cables 350 are pulled out in the Y direction, the cable connection positions P of the plurality of sets of the plurality of connections 340b are non-overlapping with each other as viewed in the Y direction, which is the direction in which the external line cables 350 are pulled out. Accordingly, when the external line cables 350 are pulled out in the Y direction, the plurality of external line cables 350 can be substantially linearly pulled out from the cable connection positions P in the direction (Y direction) in which the external line cables 350 are pulled out without interfering with each other. Consequently, similarly to the first embodiment, when the external line cables 350 are pulled out in a forward-rearward direction (Y direction), an increase in the size of the device can be significantly reduced or prevented while application of stress to the external line cables 350 caused by bending of the external line cables 350 is significantly reduced or prevented.

According to the third embodiment, as described above, the external line cables 350 are pulled rearward (in the Y2 direction) in the Y direction from the cable connection positions P. Furthermore, the cable connection positions P are located on the end side (Y2 side) opposite to the side (Y1 side) on which the connections 340b are connected to the portions of the bus bars 340 other than the connections 340b in the connections 340b. Accordingly, as compared with the case in which the cable connection positions are located on the side on which the connections 340b are connected to the portions of the bus bars 340 other than the connections 340b in the connections 340b, the external line cables 350 can be connected to the connections 340b on the further rear side (Y2 side), and thus the total length of each of the external line cables 350 can be more easily reduced.

The remaining advantageous effects of the third embodiment are similar to those of the first embodiment.

Fourth Embodiment

A fourth embodiment of the present invention is now described with reference to FIGS. 7 and 8. In this fourth embodiment, connections of bus bars are arranged differently from those in the first to third embodiments. In the figures, the same structures as those of the first embodiment are denoted by the same reference numerals.

As shown in FIG. 7, a power conversion device 400 according to the fourth embodiment of the present invention includes bus bars 440 including portions that protrude from a housing 410 in the right direction (X2 direction) of the housing 410 and connections 440b connected to external line cables 450. The housing 410 is an example of a "module storage housing" and an "external line connection cabinet" in the claims.

In the fourth embodiment, the housing 410 houses a plurality of connections 440b in which a plurality of bus bars 440 is respectively connected to the external line cables 450. In addition, the housing 410 is provided with a plurality of external line cable outlets 413a through which the external line cables 450 are pulled out of the power conversion device 400.

In the power conversion device 400, the external line cables 450 are pulled upward (in a Z1 direction). In the fourth embodiment, the external line cables 450 are pulled out of the power conversion device 400 via the external line cable outlet 413a provided on the upper side (Z1 side) of the housing 410.

Figure 8:
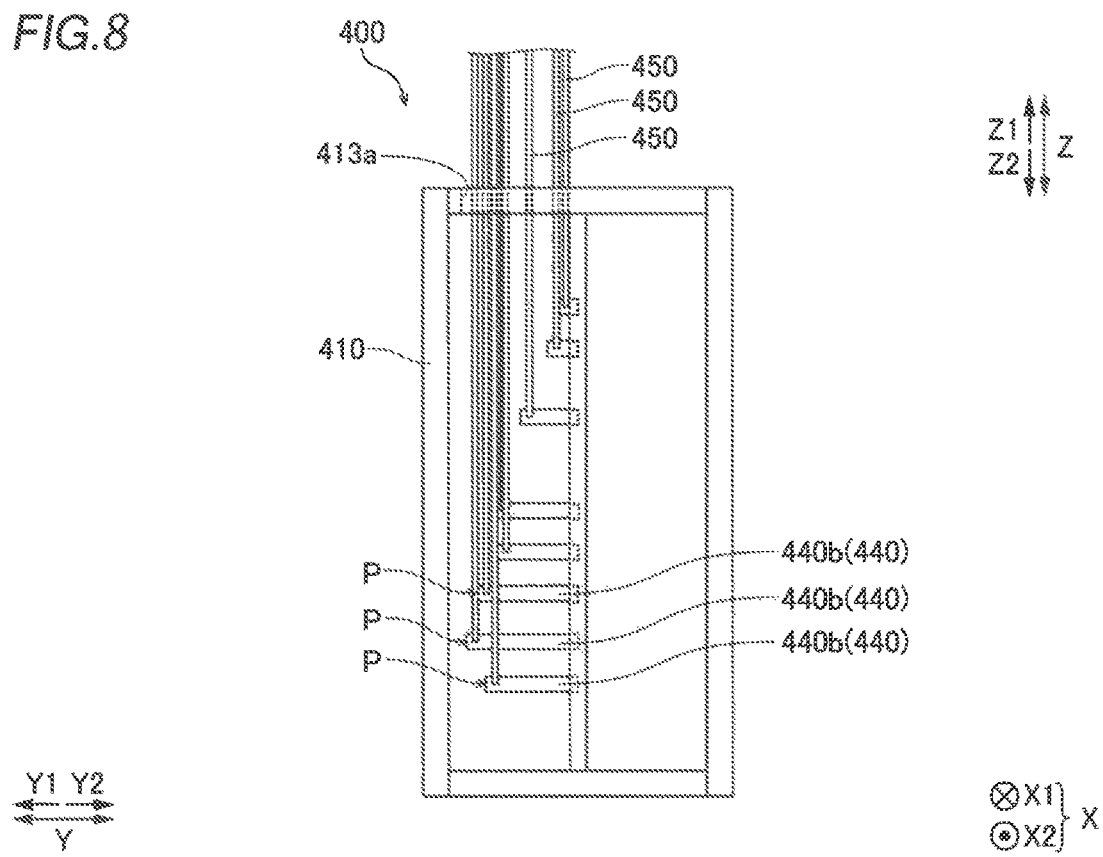
FIG. 8 is a diagram showing bus bars and external line cables in the power conversion device according to the fourth embodiment of the present invention as viewed from the side.

As shown in FIG. 8, the connections 440b of the bus bars 440 extend forward (in a Y1 direction) from the vicinity of the center of the housing 410 along the forward-rearward direction (Y direction) of the housing 410, as viewed in an X direction. In the vicinity of Y1 side ends of the bus bars 440, the bus bars 440 are connected to the external line cables 450. As shown in FIG. 8, the power conversion device 40 includes eight connections 440b provided in a Z direction, unlike the first to third embodiments in which the four sets of connections 440b, each set being aligned in the X direction, are aligned in the Z direction.

In the power conversion device 400, as shown in FIGS. 7 and 8, similarly to the first to third embodiments, cable connection positions P, at which the external line cables 450 are connected to the connections 440b, are non-overlapping with each other as viewed from the side (Z1 direction side) on which the external line cables 450 are pulled out. In the power conversion device 400, the number of connections 440b aligned in the X direction is one or two such that five or more sets of connections 440b are provided in the Z direction, unlike the first to third embodiments in which the four sets of connections, each set being aligned in the X direction, are aligned in the Z direction.

The remaining structures of the fourth embodiment are similar to those of the first embodiment.

Advantageous Effects of Fourth Embodiment

According to the fourth embodiment, the following advantageous effects are achieved.

According to the fourth embodiment, as described above, the connections 440b of the bus bars 440 to the external line cables 450 include five or more sets obtained by combining sets in which only one connection 440b is aligned in the X direction and sets in which two connections 440b are aligned in the X direction, the five or more sets being aligned in the Z direction. Accordingly, the number of connections 440b aligned in the X direction is smaller than the number of connections 40b (240b, 340b) in the first to third embodiments, and thus the size of the external line connection cabinet arranged for connecting the external line cables 450 to the bus bars 440 can be reduced in the left-right direction (X direction) of the housing 410.

The remaining advantageous effects of the fourth embodiment are similar to those of the first embodiment.

Fifth Embodiment

A fifth embodiment of the present invention is now described with reference to FIG. 9. In this fifth embodiment, external line cables 550 are pulled rearward, unlike the fourth embodiment in which the external line cables 450 are pulled upward. In the figure, the same structures as those of the fourth embodiment are denoted by the same reference numerals.

Figure 9:
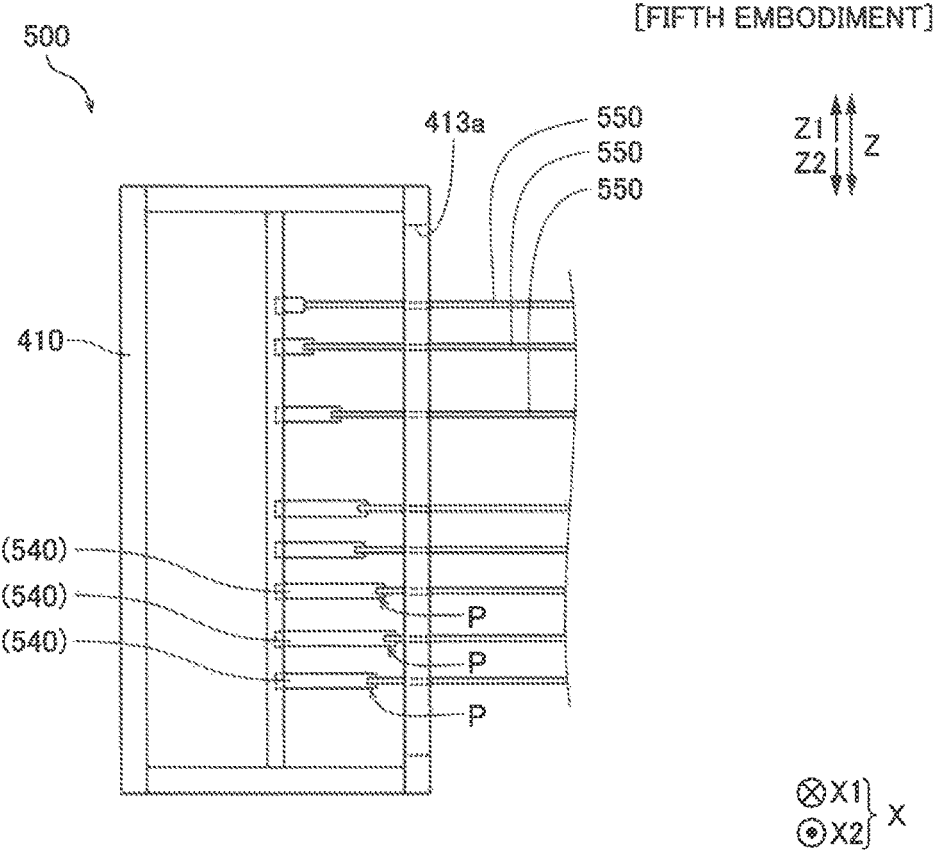
FIG. 9 is a diagram showing bus bars and external line cables in a power conversion device according to a fifth embodiment of the present invention as viewed from the side.

As shown in FIG. 9, a power conversion device 500 according to the fifth embodiment of the present invention includes bus bars 540 including portions that protrude in the right direction (X2 direction) of a housing 410 and connections 540b connected to the external line cables 550. The housing 410 is an example of a "module storage housing" in the claims.

In the power conversion device 500, the external line cables 550 are pulled rearward (in a Y2 direction). In the fifth embodiment, the external line cables 550 are pulled out of the power conversion device 500 via an external line cable outlet 413a provided on the rear side (Y2 side) of the housing 410.

As shown in FIG. 9, the connections 540b of the bus bars 540 extend rearward (in the Y2 direction) from the vicinity of the center of the housing 410 along the forward-rearward direction (Y direction) of the housing 410 as viewed in an X direction. The bus bars 540 are respectively connected to the external line cables 550 in the vicinity of Y2 side ends of the bus bars 540. In the power conversion device 500, the cable connection positions P of the connections 540b are located on the front side (Y1 side) of the housing 410.

The remaining structures of the fifth embodiment are similar to those of the fourth embodiment.

Advantageous Effects of Fifth Embodiment

According to the fifth embodiment, the following advantageous effects are achieved.

According to the fifth embodiment, as described above, unlike the third embodiment in which the cable connection positions P are located on the rear sides (Y2 sides) of the housings 10, the cable connection positions P of the connections 540b are located on the front side (Y1 side) of the housing 410. Accordingly, even when the external line cables 550 are pulled out to the rear side (Y2 side) of the housing 410, the connections 540b do not protrude to the rear side (Y2 side) of the housing 410, and thus the degree of freedom in installing the power conversion device 500 can be improved.

The remaining advantageous effects of the fifth embodiment are similar to those of the first embodiment.

MODIFIED EXAMPLES

The embodiments disclosed this time must be considered as illustrative in all points and not restrictive. The scope of the present invention is not shown by the above description of the embodiment but is limited by the scope of claims for patent, and all modifications (modified examples) within the meaning and scope equivalent to the scope of claims for patent are further included.

For example, while a plurality of connections 41b (241b, 341b), 42b (242b, 342b), 43b (243b, 343b), and 44b (244b, 344b) of the bus bars 41 (241, 341) connected to the input-side switches 21, the bus bars 42 (242, 342) connected to the output-side switches 23, the bus bars 43 (243, 343) connected to the bypass power supply 31, and the bus bars 44 (244, 344) connected to the DC reactor 24 are aligned in the X direction in each of the aforementioned first to third embodiments, and one or two connections 440b (540b) of the bus bars 440 (540) connected to the input-side switches, the output-side switches, the bypass power supply, and the DC reactor are aligned in the X direction in each of the aforementioned fourth and fifth embodiments, the present invention is not restricted to this. According to the present invention, some or all of the connections connected to the input-side switches, the output-side switches, the bypass power supply, and the DC reactor may alternatively be unaligned in the X direction.

While the external line cables 50 (450) are pulled upward in each of the aforementioned first and fourth embodiments, the external line cables 250 are pulled downward in the aforementioned second embodiment, and the external line cables 350 (550) are pulled rearward in each of the aforementioned third and fifth embodiments, the present invention is not restricted to this. According to the present invention, the external line cables may alternatively be pulled forward. Furthermore, the external line cables may alternatively be pulled out in a plurality of directions among upward, downward, forward, and rearward directions.

While the cable connection positions P are located at two positions of the distance R1 and the distance R2 from the rear sides (Y2 sides) of the housings 10 as viewed in the X direction in each of the aforementioned first to third embodiments, the present invention is not restricted to this. According to the present invention, the cable connection positions may alternatively be located at three or more positions of different distances from the rear sides of the housings as viewed in the X direction.

While the bus bars 40 (240, 340, 440, 540) are each made of a flat plate-shaped member(s) that extends in the X direction, the Y direction, or the Z direction in the external line connection cabinet 13 in each of the aforementioned first to fifth embodiments, the present invention is not restricted to this. According to the present invention, the bus bars may alternatively be made of a flat plate-shaped member(s) that extends in a direction other than the X direction, the Y direction, and the Z direction.

While the bus bars 40 (240, 340, 440, 540) are each made of a flat plate-shaped member(s) in each of the aforementioned first to fifth embodiments, the present invention is not restricted to this. According to the present invention, the bus bars may alternatively include a portion having a shape other than a flat plate shape, such as a rod shape.

While a total of four connections 44b (244b, 344b) of the bus bars 44 (244, 344) connected to the DC reactor 24, two of which correspond to the positive electrode and the other two of which correspond to the negative electrode, are provided in each of the aforementioned first to fifth embodiments, the present invention is not restricted to this. According to the present invention, a total of two connections of the bus bars connected to the DC reactor, one of which corresponds to the positive electrode and the other of which corresponds to the negative electrode, may alternatively be provided. Furthermore, three connections may alternatively be provided for each of the positive electrode and the negative electrode.

While at the cable connection positions P in the vicinity (one ends of the connections 40b (240b, 340b, 440b, 540b)) of the tips of the bus bars 40 (240, 340, 440, 540), the bus bars 40 (240, 340, 440, 540) are connected to the external line cables 50 (250, 350, 450, 550) in each of the aforementioned first to fifth embodiments, the present invention is not restricted to this. According to the present invention, the bus bars may alternatively be connected to the external line cables at positions other than the vicinities of the tips of the bus bars (the vicinities of ends opposite to the side on which the connections are connected to other portions of the bus bars).

While the connections 40b (240b, 340b, 440b, 540b) are provided as members separate from the portions 40a that protrude to the outside of the housings 10 (410), and are attachable to and detachable from the portions of the bus bars 40 (240, 340, 440, 540) other than the connections 40b (240b, 340b, 440b, 540b) by the fasteners in each of the aforementioned first to fifth embodiments, the present invention is not restricted to this. According to the present invention, the bus bars may alternatively be formed integrally from the portions that protrude to the outside of the housings to the connections connected to the external line cables.

While the connections 44b (240b, 340b, 440b, 540b) extend in the forward-rearward direction (Y direction) of the housings 10 (410) in each of the aforementioned first to fifth embodiments, the present invention is not restricted to this. According to the present invention, the connections may alternatively extend in the left-right direction (X direction) or the upward-downward direction (Z direction) of the housings.

While the power conversion module 20 is configured as a three-phase AC circuit in each of the aforementioned first to fifth embodiments, the present invention is not restricted to this. According to the present invention, the power conversion module may alternatively be configured as a single-phase AC circuit, a two-phase AC circuit, or a circuit obtained by combining a three-phase AC circuit, a single-phase AC circuit, and a two-phase AC circuit.

What is claimed is:

1. A power conversion device comprising:
a power conversion module including at least, an input-side switch into which AC power is input from an AC source, a power converter connected to the input-side switch, and an output-side switch through which the AC power is output from the power converter;
a module storage housing that houses the power conversion module; and
a plurality of bus bars connected to at least the input-side switch and the output-side switch of the power conversion module inside the module storage housing, the plurality of bus bars being connected to external line cables outside the module storage housing; wherein
connections of the plurality of bus bars connected to the input side switch and the output side switch have a flat plate shape, and include
input side connections as the connections of each of the plurality of bus bars connected to the input side switch which are separated from each other and arranged in a first direction, which is a left-right direction of the module storage housing, and
output side connections as the connections of each of the plurality of bus bars connected to the output side switch which are separated from each other and arranged in the first direction, and separated from the input side connections in a second direction, which is an upward-downward direction of the module storage housing, and
wherein the input side connections are arranged not to overlap with the output side connections when viewed in the second direction.

2. The power conversion device according to claim 1, wherein
the connections include a plurality of sets of a plurality of connections aligned as one set in the first direction, the plurality of sets being aligned in the second direction; and
when the external line cables are pulled out in the second direction or a third direction, the third direction being a depth direction of the module storage housing, cable connection positions of the plurality of sets of the plurality of connections are non-overlapping with each other as viewed in the second direction.

3. The power conversion device according to claim 2, wherein the connections extend along the third direction.

4. The power conversion device according to claim 3, wherein
the external line cables are pulled upward in the second direction from the cable connection positions; and
the connections include a first connection disposed on an upper side in the second direction, a cable connection position of which is located at a first distance from a rear side of the module storage housing as viewed in the first direction, and a second connection disposed on a lower side in the second direction, a cable connection position of which is located at a second distance, which is larger than the first distance, from the rear side of the module storage housing as viewed in the first direction.

5. The power conversion device according to claim 3, wherein
the external line cables are pulled downward in the second direction from the cable connection positions; and
the connections include a third connection disposed on a lower side in the second direction, a cable connection position of which is located at a third distance from a rear side of the module storage housing as viewed in the first direction, and a fourth connection disposed on an upper side in the second direction, a cable connection position of which is located at a fourth distance, which is larger than the third distance, from the rear side of the module storage housing as viewed in the first direction.

6. The power conversion device according to claim 3, wherein
the external line cables are pulled rearward in the third direction from the cable connection positions; and
the cable connection positions are located on an end side opposite to a side on which the connections are connected to portions of the plurality of bus bars other than the connections in the connections.

7. The power conversion device according to claim 1, wherein
each of the plurality of bus bars includes portions that extend in directions different from each other outside the module storage housing; and
the portions that extend in the directions different from each other include a portion that protrudes from an inside of the module storage housing to the outside of the module storage housing and a connection.

8. The power conversion device according to claim 7, wherein the connection is provided as a member separate from at least the portion that protrudes to the outside of the module storage housing, and is attachable to and detachable from a portion of each of the plurality of bus bars other than the connection by a fastener.

9. The power conversion device according to claim 1, wherein the set of flat plate-shaped connections connected to the input side switch is arranged side by side, and the set of the flat plate-shaped connections connected to the output side switch is arranged side by side.

10. The power conversion device according to claim 1, wherein the flat plate-shaped connections of the plurality of bus bars include first flat plates separated from and arranged parallel to each other in the first direction, and second flat plates separated from and arranged parallel to each other in the first direction, and
the first flat plates are separated from the second flat plates in the second direction perpendicular to the first direction, and arranged not to overlap with the second flat plates when viewed in the second direction.

11. The power conversion device according to claim 10, wherein the flat plate-shaped connections of the plurality of bus bars further include third flat plates separated from and arranged parallel to each other in the first direction, and fourth flat plates separated from and arranged parallel to each other in the first direction, and
the third flat plates are separated from the fourth flat plates in the second direction, and arranged not to overlap with the first, second and third flat plates when viewed in the second direction.

12. A power conversion device comprising:
a power conversion module including at least, an input-side switch into which AC power is input from an AC source, a power converter connected to the input-side switch, and an output-side switch through which the AC power is output from the power converter;
a module storage housing that houses the power conversion module;
a plurality of bus bars connected to at least the input-side switch and the output-side switch of the power conversion module inside the module storage housing, the plurality of bus bars having flat plate-shaped connections and being connected to external line cables outside the module storage housing; and an external line connection cabinet that houses the flat plate-shaped connections in which the plurality of bus bars is respectively connected to the external line cables, the external line connection cabinet including an external line cable outlet through which the external line cables are pulled out; wherein input side connections as the flat plate-shaped connections of each of the plurality of bus bars connected to the input side switch are separated from each other and arranged in a first direction, which is a left-right direction of the module storage housing, output side connections as the flat plate-shaped connections of each of the plurality of bus bars connected to the output side switch are separated from each other and arranged in the first direction, and separated from the input side connections in a second direction, which is an upward-downward direction of the module storage housing, and the input side connections are arranged not to overlap with the output side connections when viewed in the second direction.

13. The power conversion device according to claim 12, further comprising another module storage housing containing a power conversion module and a plurality of bus bars, the module storage housing, the another module storage housing and the external line connection cabinet being arranged side by side in a row such that the external line connection cabinet is an end of the row.

14. The power conversion device according to claim 13, wherein the plurality of bus bars in the module storage housing and the plurality of bus bars of the another module storage housing extend to the external line connection cabinet.

* * * * *